(12) United States Patent
Tai et al.

(10) Patent No.: US 9,422,151 B1
(45) Date of Patent: Aug. 23, 2016

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Wen-Chuan Tai, Hsinchu (TW); Alexander Kalnitsky, San Francisco, CA (US); Hsin-Ting Huang, Taoyuan County (TW); Hsiang-Fu Chen, Hsinchu County (TW); Jiou-Kang Lee, Hsinchu County (TW); Ching-Kai Shen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/858,414

(22) Filed: Sep. 18, 2015

(51) Int. Cl.
*B81B 3/00* (2006.01)
*B81C 1/00* (2006.01)

(52) U.S. Cl.
CPC ........... *B81B 3/0097* (2013.01); *B81C 1/00158* (2013.01); *B81B 2203/0127* (2013.01)

(58) Field of Classification Search
CPC ...................... H01L 2924/1461; H01L 45/124
USPC ........................................... 257/420
See application file for complete search history.

(56) References Cited

U.S. PATENT DOCUMENTS

2011/0213075 A1* 9/2011 Goshima ............ C08G 73/1042
524/588

* cited by examiner

*Primary Examiner* — Elias M Ullah
(74) *Attorney, Agent, or Firm* — WPAT, P.C., Intellectual Property Attorneys; Anthony King

(57) ABSTRACT

A semiconductor device includes a substrate and a movable membrane proximal to the substrate. The semiconductor device further includes a mesa over the substrate and protruded from a surface of the substrate toward the movable membrane. The mesa includes a strike hitting portion configured to receive a striking force from the membrane and a hybrid stress buffer under the strike hitting portion, wherein the hybrid stress buffer includes at least two layers which are distinguishable by a difference in hardness.

20 Claims, 12 Drawing Sheets

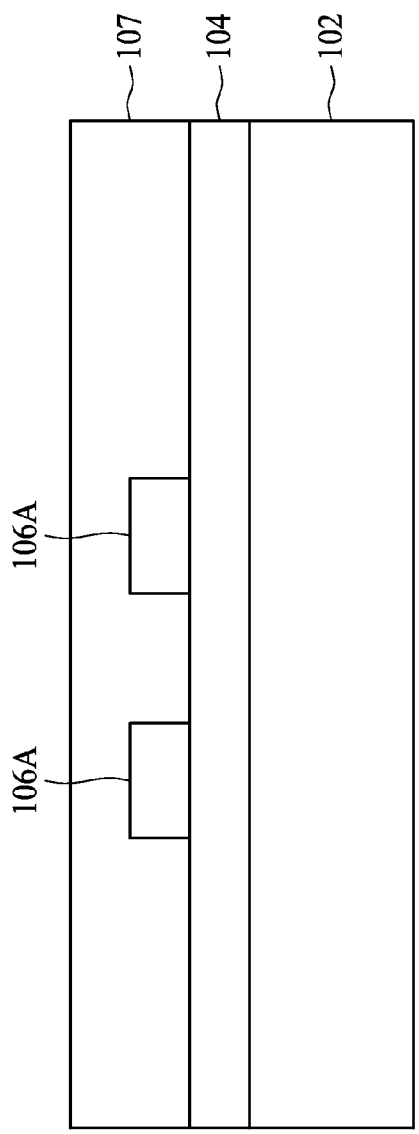
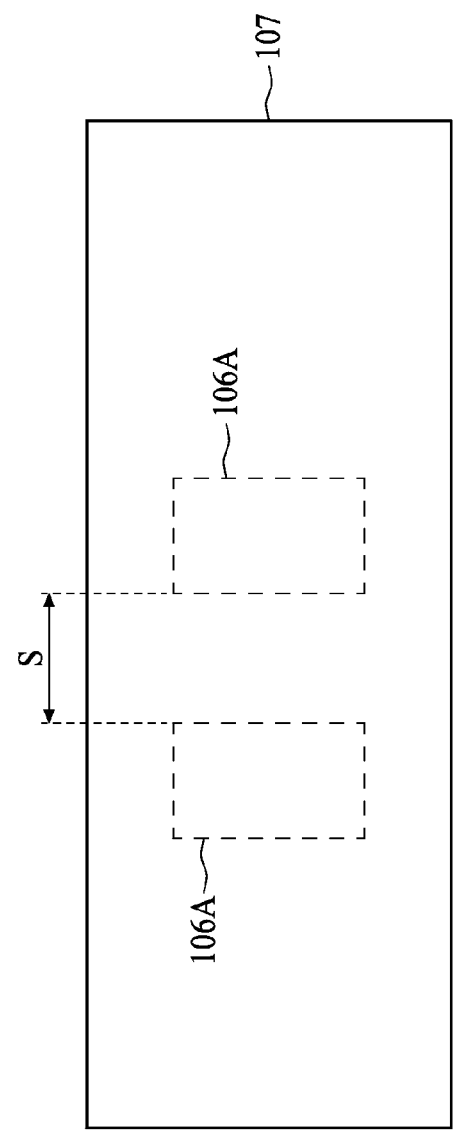

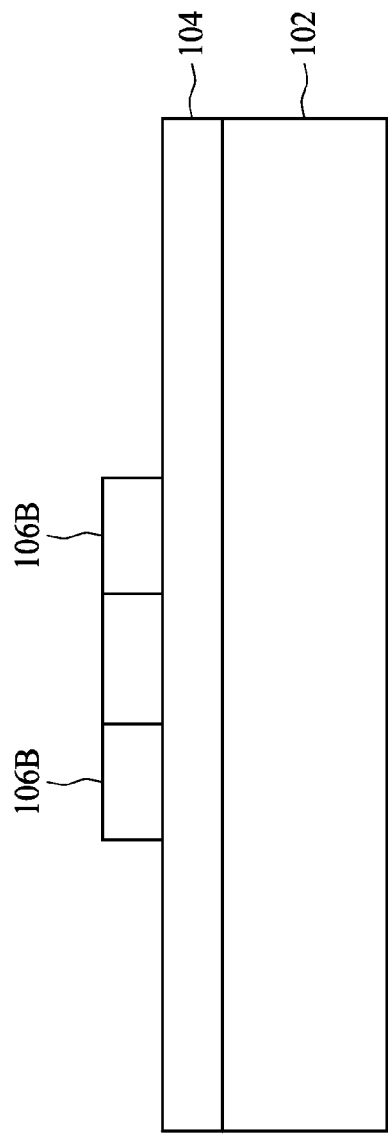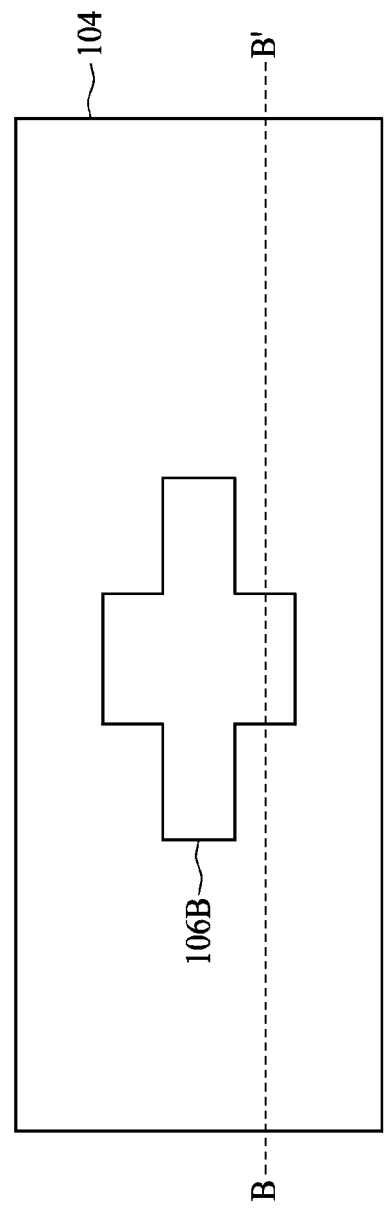

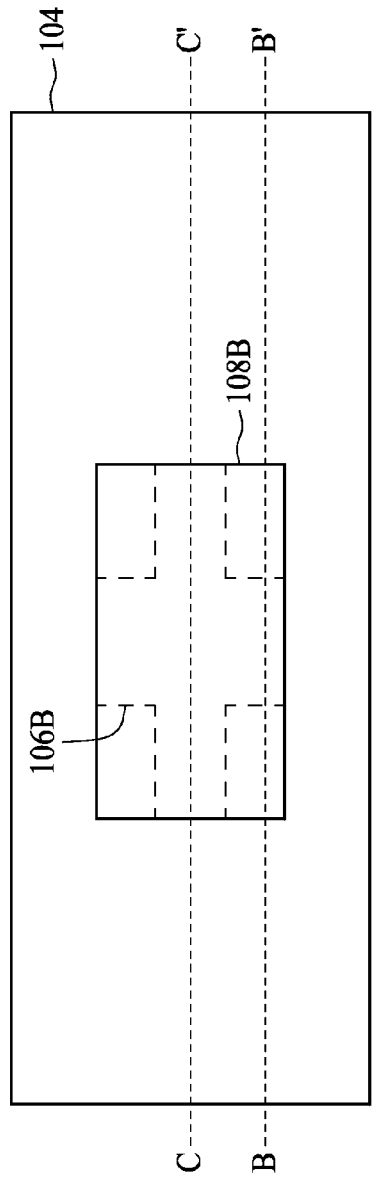
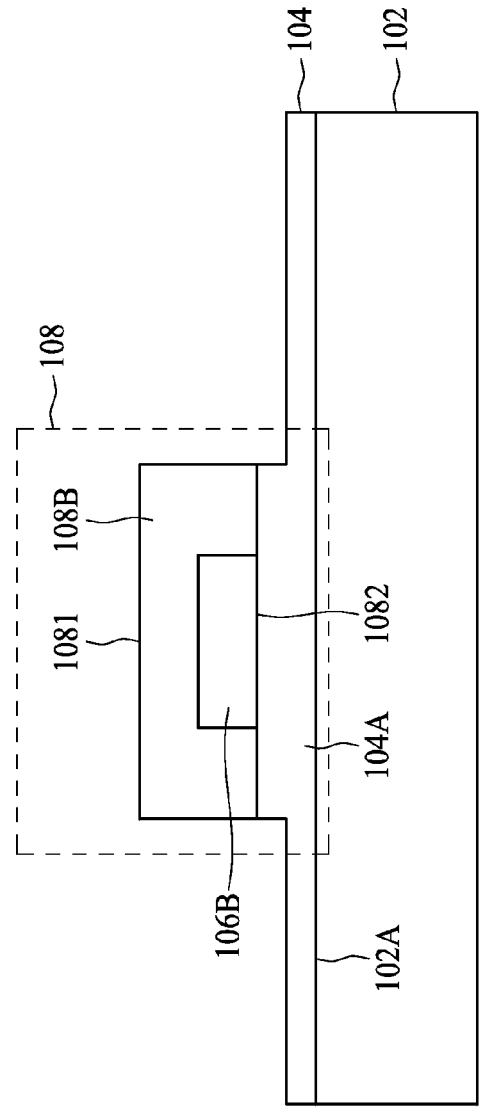

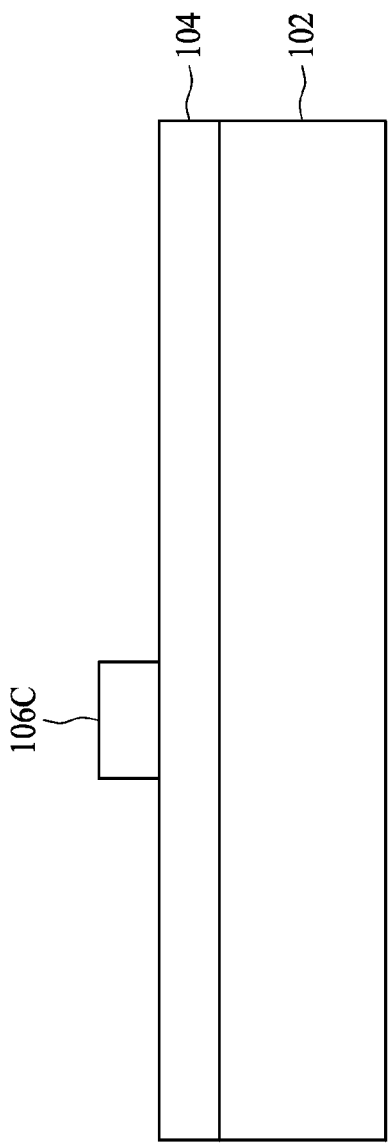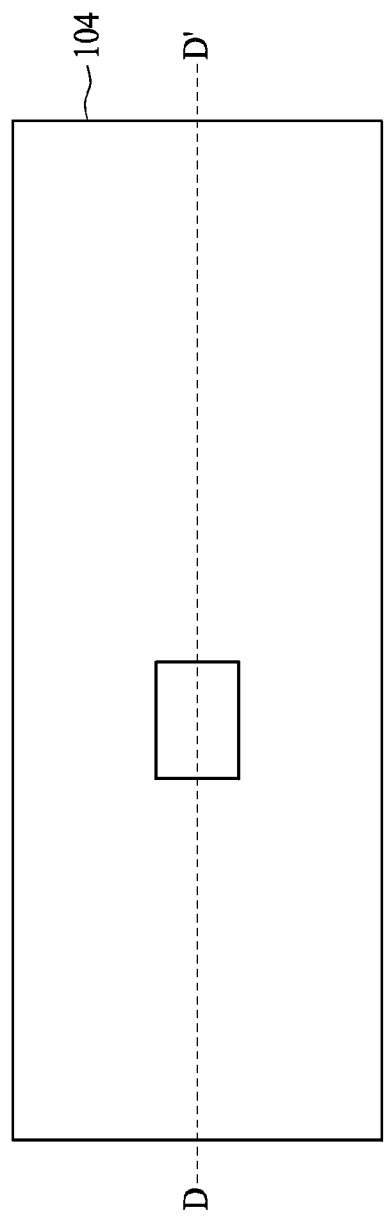

SEMICONDUCTOR DEVICE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. MEMS devices are widely used in various applications. MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. The devices involve many complicated steps and increases complexity of manufacturing. The increase in complexity of manufacturing may cause deficiencies such as high yield loss, warpage, low signal to noise ratio (SNR), etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2G are cross sectional views illustrating several operations of a method of manufacturing a semiconductor device in accordance with some embodiments.

FIG. 3A to FIG. 3G are cross sectional views illustrating several operations of a method of manufacturing a semiconductor device in accordance with some embodiments.

FIG. 4A to FIG. 4F are cross sectional views illustrating several operations of a method of manufacturing a semiconductor device in accordance with some embodiments.

DETAILED DESCRIPTION

Figure 1:
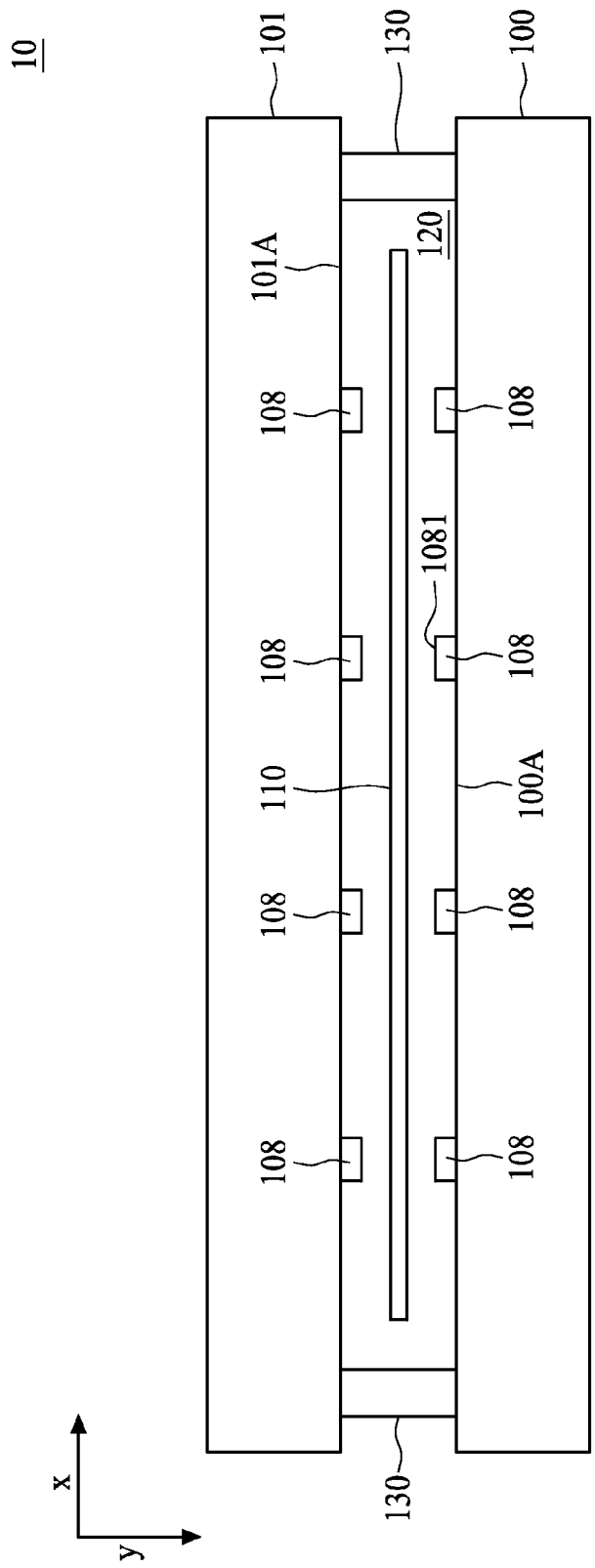
FIG. 1 is a cross sectional view semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMS device includes a cavity and allows a movable membrane disposed within the cavity and responding to an ambient change. The movement or oscillation of the membrane creates a change in an amount of an electrical characteristic such as capacitance, or resistance change between the membrane and a structure in the MEMS device. The amount of change would then be translated into an electrical signal accordingly. Since the membrane is a movable member, stiction might occur while the membrane strikes any surface that surrounds the cavity.

In the present disclosure, an anti-stiction structure is introduced in the MEMS device on the surface surrounding the cavity. The movable membrane strikes the anti-stiction structure before it contacts the surrounding surface. Moreover, the anti-stiction structure includes multiple layers stacked on a substrate and has a mixed hardness arrangement of the stacked layers.

FIG. 1 is a cross sectional view of a semiconductive MEMS device 10. The MEMS device 10 includes a cavity 120. The cavity 120 is enclosed by the surrounding walls and the pressure inside the cavity may be at a very low vacuum level such as mTorr or micro-Torr, or any other predetermined pressure (e.g. atm or sub atm, etc.). A membrane 110 is disposed inside the cavity 120. In the present drawing, the membrane 110 is illustrated as a member floating in the cavity 120; however, the membrane 110 is constrained at a predetermined location, which is not shown in the drawing for a purpose of simplification. The membrane 110 is configured to perform a mechanical movement inside the cavity 120 along at least one dimension. The cavity 120 is sandwiched between substrates 100 and 101, which may be connected by an interposer 130. The substrates 100 and 101 are on opposite sides of the cavity 120.

Substrate 100 or substrate 101 may include a semiconductor material. The substrate provides a matrix to accommodate some circuitries therein. In some embodiments, the substrate includes integrated CMOS circuits to covert the membrane change amount into an electrical signal. In some embodiments, some semiconductor components are built in the substrate in order to measure or detect the position change or deformation of the membrane 110. In some embodiments, the substrate may include silicon, silicon dioxide, aluminum oxide, sapphire, germanium, gallium arsenide (GaAs), an alloy of silicon and germanium, or indium phosphide (InP). Substrate 100 and substrate 101 respectively has a surface 100A and 101A that are facing each other and surround the cavity 120. Over the surface 100A or 101A, there is at least one mesa 108 disposed thereon. In FIG. 1, both substrates 100 and 101 are designed to have several mesas 108 disposed over the surfaces 100A or 101A. The mesa 108 is protruded from surfaces 100A and 101A and toward the membrane 110, such that the mesa 108 is more proximal to the membrane 110 than the surfaces 100A or 101A, over which the mesas 108 are disposed (or called associated surface of the mesa). As the example shown in FIG. 1, the mesa 108 (over the substrate 100) has a height protruded away from the associated landing surface 100A, therefore a top surface 1081 of the mesa 108 is closer to the membrane 110 compared to the surface 100A.

In some embodiments, when the device 10 is in a static condition, the membrane 110 disposed inside the cavity 120 has a predetermined distance spaced from either the substrate 100 or the substrate 101. As the device 10 is in operation, the mechanical movement of the membrane 110 may be transferred into an oscillation which is substantially along the y direction. In some embodiments, as the amplitude of the oscillation is large enough, at least a portion of the membrane 110 may be overshot and relocated to be in contact with the substrate 100 or the substrate 101. By including the design of anti-stiction mesa 108, before reaching the surface 100A or surface 101A, the relocated membrane portion is in contact with the mesa 108 instead of the surface 100A or surface 101A. Therefore, the contact between the membrane 110 and surface 100 or 101 can be prohibited.

Figure 2A:
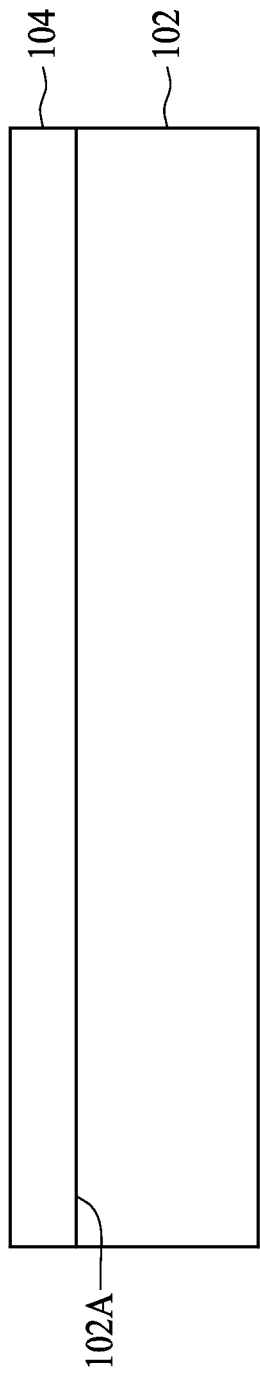

FIG. 2A to FIG. 2G are drawings of a method of forming a mesa on a substrate in a MEMS device according to some embodiments of the present disclosure. The drawings only illustrate a substrate on one side but can be applied to the substrate on the other side as well. In FIG. 2A, a substrate 102 is provided. The substrate 102 may include silicon, silicon dioxide, aluminum oxide, sapphire, germanium, gallium arsenide (GaAs), an alloy of silicon and germanium, or indium phosphide (InP). In some embodiments, the substrate 102 is an SOI (silicon on insulator) or an EPI (epitaxial) substrate.

Over the substrate 102, a thin film layer 104 is disposed thereon. In some embodiments, the thin film layer 104 is disposed over a surface 102A of the substrate 102 and there may be at least one intermediate layer between the substrate 102 and the layer 104. The layer 104 can be disposed by deposition. In some embodiments, the deposition is vapor deposition including any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like. PECVD, HDPCVD, LPCVD. The layer 104 may include dielectric material such as silicon oxide, silicon nitride, silicon oxynitride, high-k dielectric material, other suitable dielectric material, and/or combinations thereof. Examples of high-k dielectric materials include $HfO2$, $HfSiO$, $HfSiON$, $HfTaO$, $HfTiO$, $HfZrO$, zirconium oxide, aluminum oxide, hafnium dioxide-alumina ($HfO2$-$Al_2O_3$) alloy, other suitable high-k dielectric materials, and/or combinations thereof. However, this is not a limitation of the present disclosure.

Figure 2B:
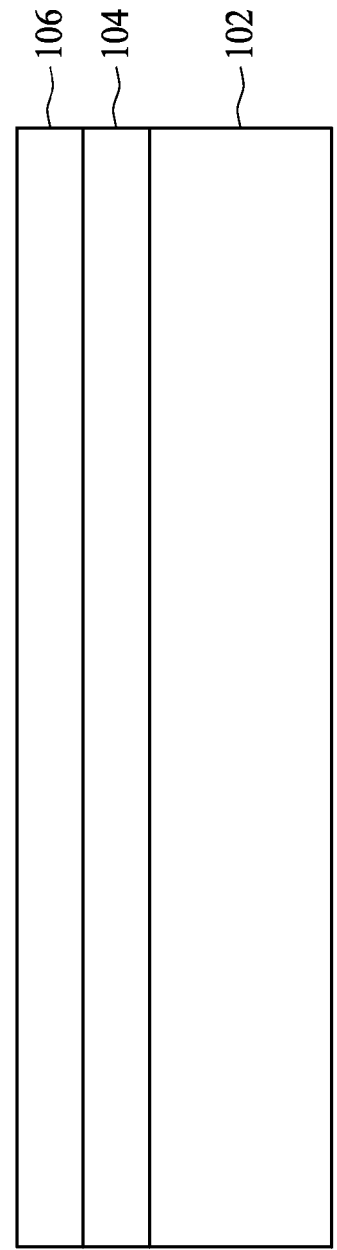

Another layer 106 is disposed on the layer 104 as in FIG. 2B. In some embodiments, layer 106 has a different hardness from the layer 104. In some embodiments, the hardness of layer 104 is greater than a hardness of layer 106. The hardness measurement can be performed by various scales such as Rockwell, Vickers, Shore, or Brinell.

The layer 106 can be disposed by deposition and in some embodiments; layer 106 is deposited by vapor deposition including any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like. PECVD, HDPCVD, LPCVD. In some embodiments, layer 106 includes conductive material such as gold, silver, copper, aluminum, zinc, other suitable conductive materials, and/or combinations thereof.

Figure 2C:
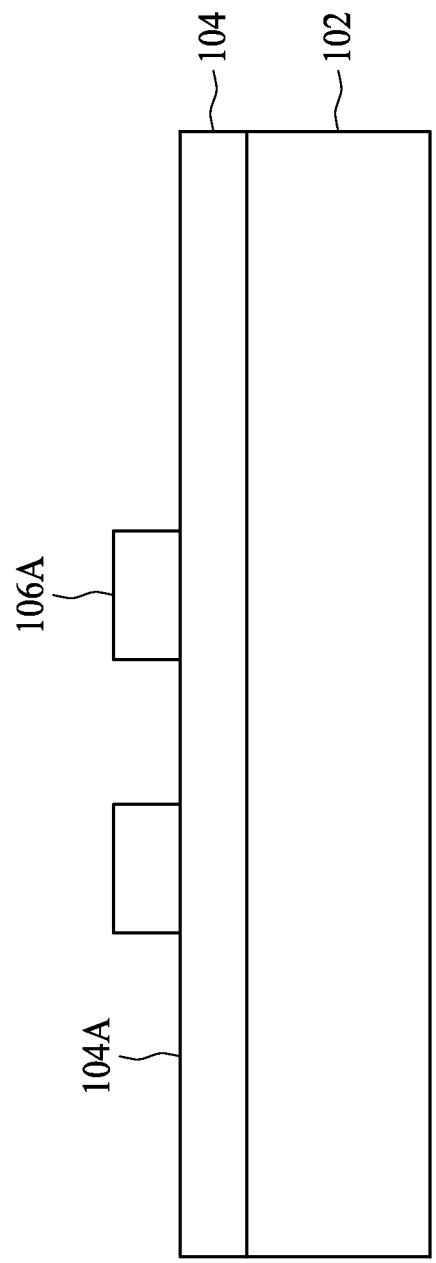

In FIG. 2C, the layer 106 is patterned to be partially removed so as to have some portions of the layer 104 exposed without covered by the layer 106. The patterning operation can be performed by etching, carving, scribing, other suitable processes, and/or combinations thereof. After the excessive material of the layer 106 is removed, only the remaining portions 106A are preserved, thus a portion of surface 104A being exposed and uncovered by the layer 106.

In FIG. 2D, another thin film layer 107 is disposed over the substrate 102. The layer 107 covers the remaining portions 106A and also contacts with layer 104 exposed from the remaining portions 106A. The layer 107 also surrounds the remaining portions 106A and contacts the sidewall of the remaining portions 106A. The layer 107 can be disposed by deposition. In some embodiments; layer 107 is deposited by vapor deposition including any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like. PECVD, HDPCVD, LPCVD. In some embodiments, layer 106 includes conductive material such as gold, silver, copper, aluminum, zinc, other suitable conductive materials, and/or combinations thereof.

The layer 107 may include dielectric material such as silicon oxide, silicon nitride, silicon oxynitride, high-k dielectric material, other suitable dielectric material, and/or combinations thereof. Examples of high-k dielectric materials include $HfO2$, $HfSiO$, $HfSiON$, $HfTaO$, $HfTiO$, $HfZrO$, zirconium oxide, aluminum oxide, hafnium dioxide-alumina ($HfO2$-$Al_2O_3$) alloy, other suitable high-k dielectric materials, and/or combinations thereof. However, this is not a limitation of the present disclosure. In some embodiments, the layer 107 and layer 104 both include a same dielectric material. In some embodiments, a hardness of the layer 107 is substantially the same as a hardness of the layer 104.

FIG. 2E is a top view of FIG. 2D. The remaining portions 106A are depicted in dotted lines since they are covered by the layer 107 and may not be visible. Each part of the remaining portions 106A is in a quadrilateral shape. The remaining portions 106A are arranged in a pair and spaced laterally in a distance S. The gap between the paired remaining portions 106A is filled with material of layer 107.

Figure 2F:
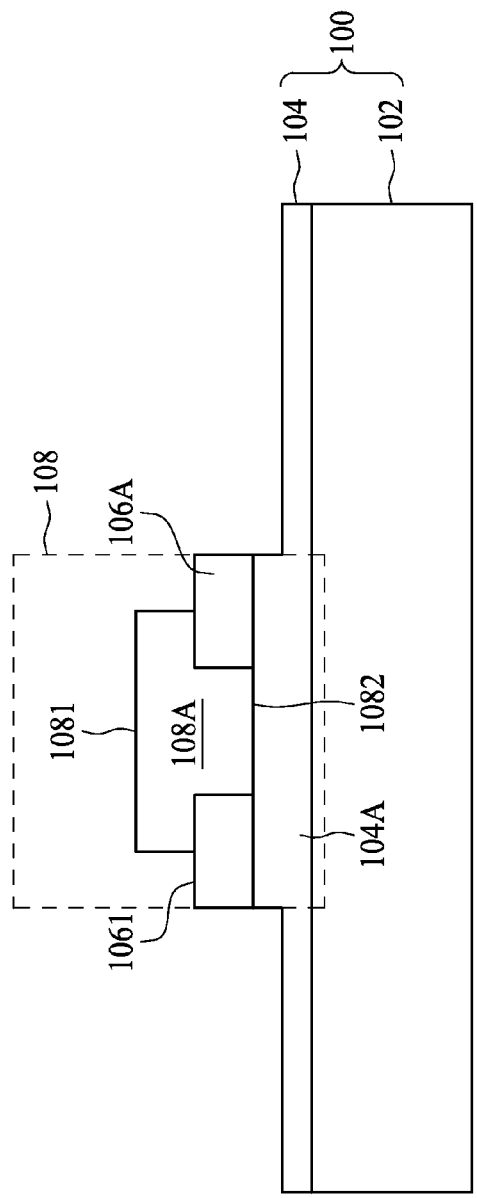

In FIG. 2F, the layer 107 is partially removed. The removal operation may include several sub-operations. For example, a photoresist is firstly disposed over the layer 107 and patterned into a designed mask. A portion of the layer 107 is masked by the photoresist. Then an etch operation is adopted to remove the unmasked portions of the layer 107. After the removal operation, a mesa 108 is formed over the substrate 102. The mesa 108 includes a material 108A, which is a remaining portion of layer 107. The material 108A is at the uppermost of the mesa 108 and more proximal to the membrane 110 of the device 10 in FIG. 1 than the other portions of the mesa 108. The material 108A has a top surface 1081 facing toward the membrane 110. In some embodiments, the top surface 1081 is configured to be in contact with the membrane 110 while the membrane 110 is oscillating and also named "strike hitting surface."

Material 108A is filled in the gap between the paired remaining portions 106A and is also extended to be higher than a top surface 1061 of the paired remaining portions 106A. A portion of the material 108A is further laterally extended to have two wings covering a portion of the top surface 1061 of the paired remaining portions 106A. Therefore, the paired remaining portions 106A are located between the material 108A and the substrate 100.

Figure 2G:
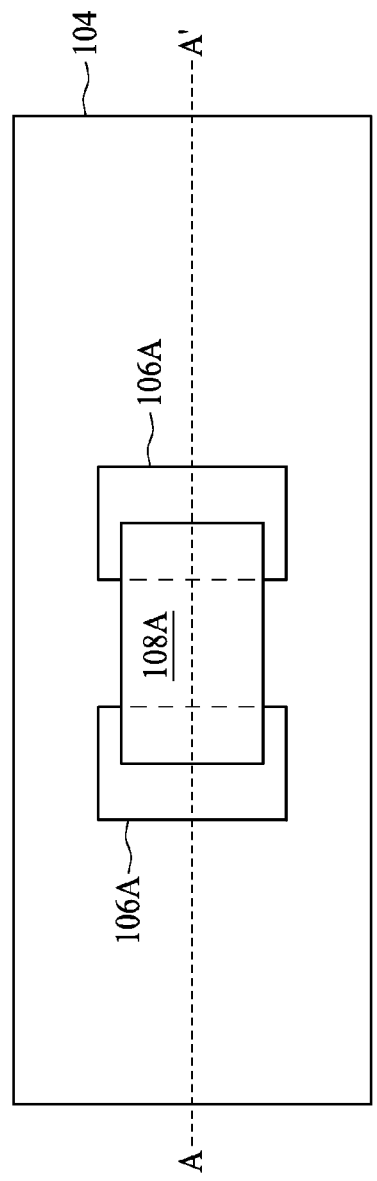

FIG. 2G is a top view of FIG. 2F and FIG. 2F is a cross section view along line AA' in FIG. 2G. From the top view, the paired remaining portions 106A are arranged substantially symmetrical with respect to the material 108A. In some embodiments, the geometric center of the material 108A in the lateral direction (parallel to line AA') is substantially aligned with the lateral geometric center of the paired remaining portions 106A. In some embodiments, the lateral central line of the material 108A overlaps with the lateral central line of the paired remaining portions 106A. Because the material 108A and the paired remaining portions 106A are laterally aligned, when an external force strikes on the top surface 1081 of the material 108A, each part of the paired remaining portion 106A can share an equal force. In some embodiments, the material 108A has a different hardness from the paired remaining portions 106A. The paired remaining portions 106A are located under the material 108A and provide a different scheme as a buffer layer for the material 108A while the material 108A receives a striking force from the membrane. When the striking force is hitting on the top surface 1081, a portion of the striking force is further transferred to the paired remaining portions 106A through two wings of the material 108A. The paired remaining portions 106A provide a buffer zone to absorb the shock from the striking force. In some embodiments, the hardness of the paired remaining portions 106A is smaller than the hardness of the material 108A.

The material 108A is also in contact with a portion 104A of layer 104 at a surface 1082, which is opposite to the strike hitting surface 1081. The portion 104A is also partially sandwiched between the substrate 102 and the paired remaining portions 106A. In some embodiments, the portion 104A is at least partially covered by the paired remaining portions 106. In some embodiments, the portion 104A is thicker than the remaining layer 104 because the remaining layer 104 is exposed during the preceding removal operation performed on layer 107, thus a recessed surface is formed on the unmasked portion of layer 104 compared to the masked portion 104A. In some embodiments, the remaining layer 104 and substrate 102 are collectively corresponding to the substrate 100 in FIG. 1. Since the layer 104 is relatively much thinner than the substrate 102, the layer 104 is omitted in FIG. 1.

Similar to the paired remaining portions 106A, the portion 104A also serves as a buffer layer to receive the striking force transferred from the material 108A while the membrane is hitting the surface 1081. In some embodiments, the hardness of the paired remaining portions 106A is smaller than the portion 104A. In some embodiments, the hardness of the material 108A is substantially equal to the portion 104A. In some embodiments, both the material 108A and the portion 104A include a same dielectric material.

In some embodiments, a mesa 108 includes at least two different stress buffer layers disposed under the strike hitting potion, or the material 108A, and each stress buffer layer is at least partially covered by the strike hitting potion 108A. As in FIG. 2F, a first buffer layer, the paired remaining portions 106A, is partially covered by the strike hitting potion 108A at surface 1061. A second buffer layer, the portion 104A, is partially covered by the strike hitting potion 108A and partially covered by the paired remaining portions 106A. These two buffer layers have two different harnesses, i.e. one buffer layer is harder than the other. In some embodiments, the second buffer layer is harder than the first buffer layer and the first buffer layer is softer than the strike hitting portion. While the membrane is striking on the strike hitting portion, the first buffer layer absorbs a portion of the hitting force and second buffer layer absorbs remaining portion of the hitting force. With the hybrid buffer structure under the strike hitting potion, the mesa 108 is more sustainable to an abrupt or continuous strike from the membrane. Additionally, since the first buffer layer is symmetrically distributed under the force receiving surface 1081, the hitting force can be evenly distributed on the first buffer layer 106A.

In some embodiments, the first buffer layer is designed in a cross shape. FIG. 3A is a cross sectional view of a transitional structure of forming a mesa on a substrate 102. The operations of providing the substrate 102 and forming the layer 104 can be referred to the descriptions corresponding to FIG. 2A and FIG. 2B. In FIG. 3A, the forming operation of remaining portion 106B is similar to the forming operation of 106A in FIG. 2C. One of the difference between 106B and 106A is that the remaining portion 106B is in a cross shape. FIG. 3A is a cross sectional view of FIG. 3B along line BB'. In FIG. 3B, the cross shaped 106B is observed from the top view.

Figure 3C:
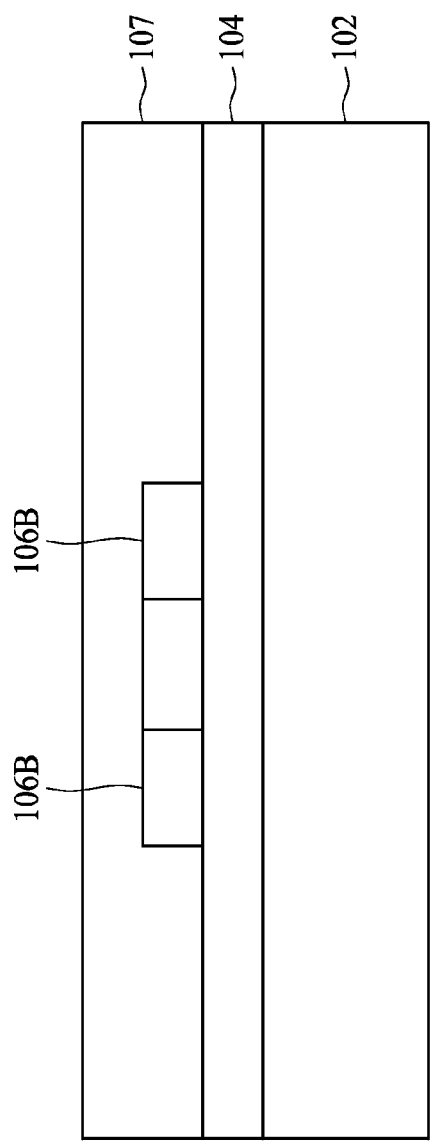
Figure 3D:
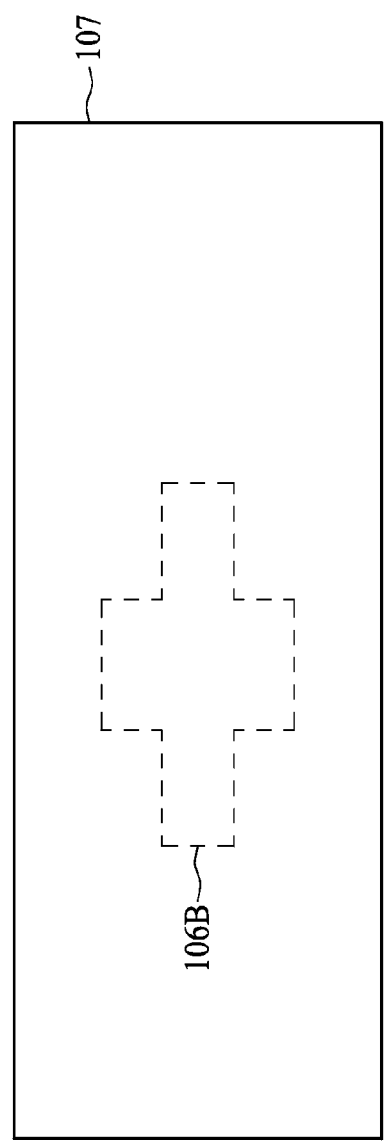

In FIG. 3C, similar to the operation corresponding to FIG. 2D, the thin film layer 107 is disposed over the substrate 102. The layer 107 covers the cross shaped portion 106B and also contacts the layer 104. The layer 107 also surrounds the cross shaped portion 106B and contacts the sidewall of the cross shaped portion 106B. The layer 107 can be disposed by deposition and in some embodiments; layer 107 is deposited by vapor deposition as in the operation corresponding to FIG. 2D. FIG. 3D is a top view of FIG. 3C. Since the cross shaped portion 106B is under the layer 107, the cross shaped portion 106B is depicted by dotted lines.

In FIG. 3E, the layer 107 is partially removed as in the operation corresponding to FIG. 2F. A mesa 108 is formed over and extruded from the surface 102A of the substrate 102. The mesa 108 includes a material 108A, which is a remaining portion of layer 107. The material 108A is at the uppermost level of the mesa 108 and is most proximal to the membrane 110 of the device 10 in FIG. 1 compared to other portions of the mesa 108. The material 108B has a top surface 1081 facing toward the membrane 110. In some embodiments, the top surface 1081 is configured to be in contact with the membrane 110 while the membrane 110 is oscillating.

Figure 3G:
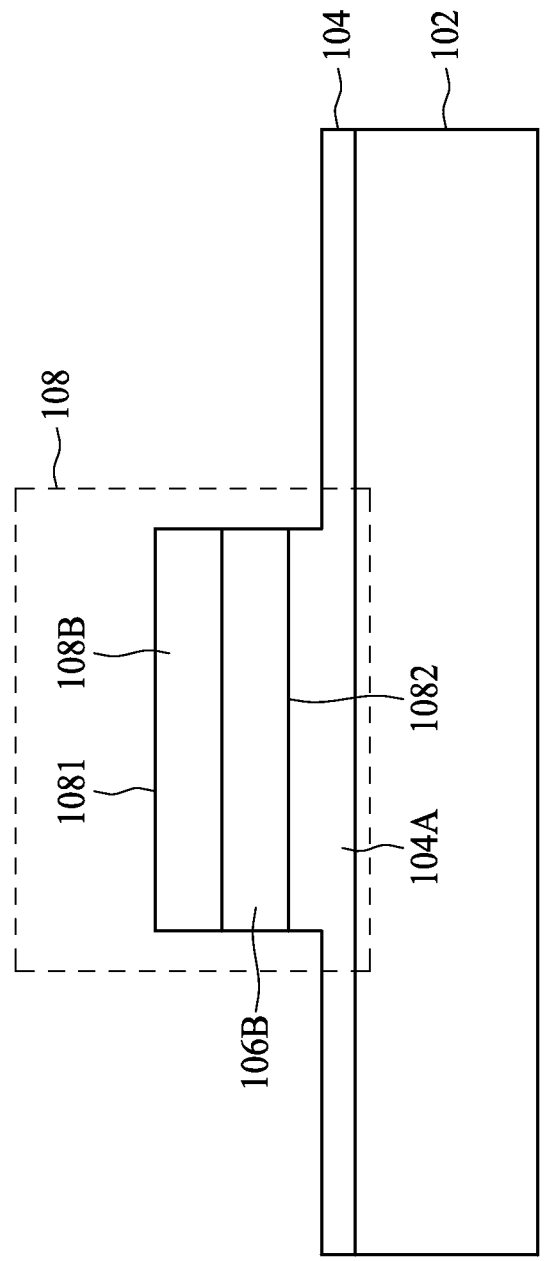

FIG. 3F is a cross sectional view of FIG. 3E along line BB'. The line BB' is cutting at one branch of the cross shaped portion 106B. FIG. 3G is another cross sectional view of FIG. 3E along line CC'. The line CC' is cutting through the crossing point of the cross shaped portion 106B. Similar to the paired remaining portions 106A in FIG. 2G, the top viewed FIG. 3E shows that the geometric center of the material 108B in the lateral direction (parallel to the plane of 104) is substantially aligned with the lateral geometric center of the cross shaped portion 106B. Because the material 108B and the cross shaped portion 106B are laterally aligned, when an external force is striking on the top surface 1081 of the material 108B, the cross shaped portion 106B can evenly distribute the striking force. In some embodiments, the material 108B has a different hardness from the cross shaped portion 106B. The cross shaped portion 106B is located under the material 108B and provides a different scheme as a buffer layer for the material 108B. While receiving a striking force from the membrane, the striking force is distributed over the top surface 1081 and a portion of the striking force is further transferred to the cross shaped portion 106B. In some embodiments, the hardness of the cross shaped portion 106B is smaller than the hardness of the material 108B.

In some embodiments, the cross shaped portion 106B is fully covered by the material 108B, i.e. there is no surface of the cross shaped portion 106B exposing from the material 108B. In some embodiments, the cross shaped portion 106B is partially covered by the material 108B and at least a sidewall (perpendicular to the plane of 104) of the cross shaped portion 106B is exposed from the material 108B.

Similar to FIG. 2F, the mesa 108 in FIG. 3F also includes a portion 104A under the cross shaped portion 106B and the material 108B. Therefore, the mesa 108 also includes at least two different stress buffer layers disposed under the strike hitting potion 108A. Each buffer layer in the mesa 108 is at least partially covered by the strike hitting potion 108A. The cross shaped portion 106B is also referred as a first buffer layer and has similar characteristics and relationship with other elements as the paired portion 106A in FIG. 2F. The portion 104A is the second buffer layer. These two buffer layers have two different harnesses, i.e. one buffer layer is harder than the other. In some embodiments, the second buffer layer is harder than the first buffer layer. The first buffer layer is softer than the strike hitting potion so as to absorb a portion of the hitting force and the remaining portion of the hitting force is absorbed by the second buffer layer, which is harder than the first buffer layer. The first buffer layer 106B is also symmetrically respect to the force receiving surface 1081 of the hitting potion 108A, therefore the hitting force is evenly distributed on the first buffer layer 106B.

In some embodiments, the first buffer layer is designed as a single block under the strike hitting portion of a mesa. FIG. 4A is a cross sectional view of a transitional structure of forming a mesa on a substrate 102. The operations of providing the substrate 102 and forming the layer 104 can be referred to the descriptions corresponding to FIG. 2A and FIG. 2B. In FIG. 4A, the forming operation of a remaining portion 106C is similar to the forming operation illustrated in FIG. 2C. The difference between 106C and 106A is that the remaining portion 106C is in a single quadrilateral block rather than a paired remaining portion. FIG. 4A is a cross sectional view of FIG. 4B along line DD'.

Figure 4C:
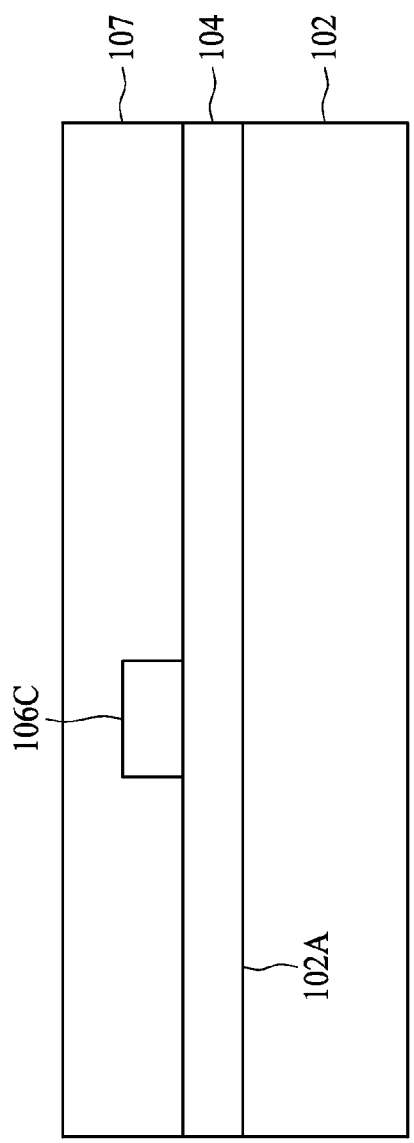
Figure 4D:
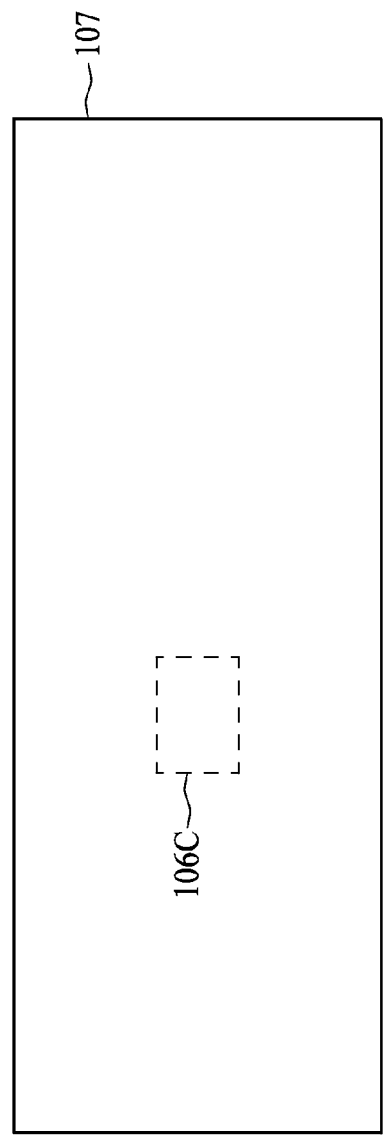

In FIG. 4C, similar to the operation corresponding to FIG. 2D, another thin film layer 107 is disposed over the substrate 102. The layer 107 covers the quadrilateral block 106C and also contacts the layer 104. The layer 107 surrounds the quadrilateral block 106C and contacts the sidewalls of the quadrilateral block 106C as well. The layer 107 can be disposed by deposition and in some embodiments; layer 107 is deposited by vapor deposition as in the operation corresponding to FIG. 2D. FIG. 4D is a top view of FIG. 4C. Since the quadrilateral block 106C is under the layer 107, the quadrilateral block 106C is depicted by dotted lines.

Figure 4E:
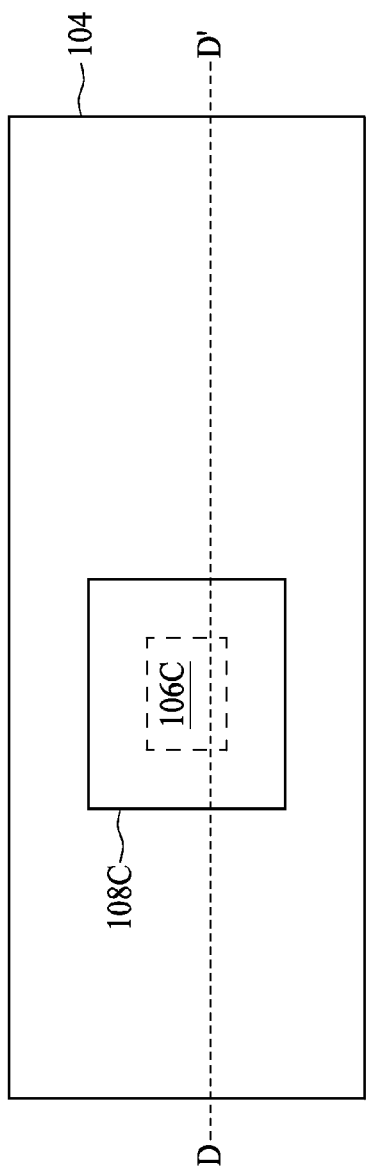

In FIG. 4E, a portion of the layer 107 is removed as in the operation corresponding to FIG. 2F. A mesa 108 is formed over and extruded from surface 102A of the substrate 102. The mesa 108 includes a material 108C, which is a remaining portion of layer 107. The material 108C is at the uppermost of the mesa 108 and most proximal to the membrane 110 of the device 10 in FIG. 1 compared to the other portions of the mesa 108. The material 108C has a top surface 1081 facing toward the membrane 110. In some embodiments, the top surface 1081 is configured to be in contact with the membrane 110 while the membrane 110 is oscillating. The material 108C is corresponding to the material 108A and 108B in other embodiments.

Figure 4F:
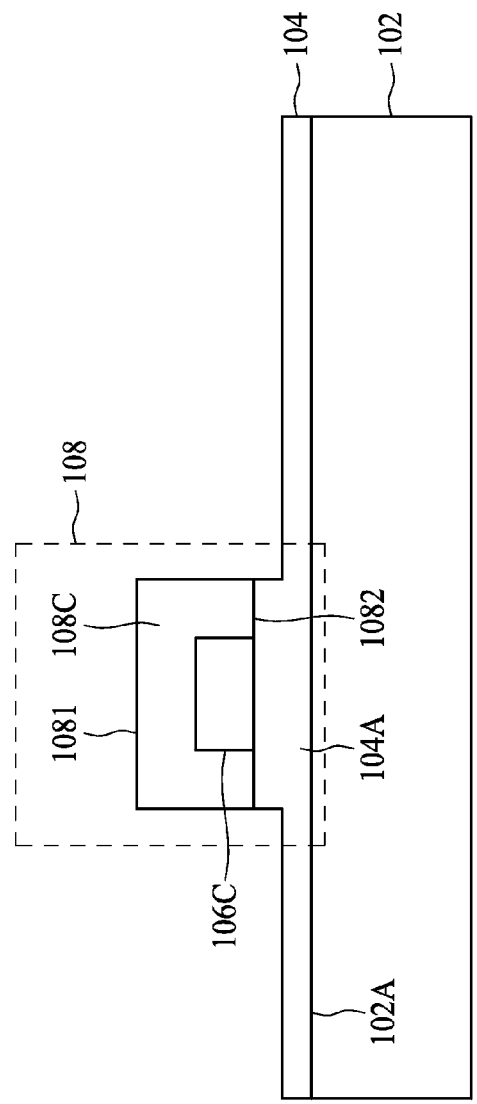

FIG. 4F is a cross sectional view of FIG. 4E along line DD'. The line DD' is cutting through the quadrilateral block 106C. Similar to the paired remaining portions 106A in FIG. 2G or the cross shaped portion 106B in FIG. 3E, the top viewed FIG. 4E shows that the geometric center of the material 108C in the lateral direction (parallel to the plane of 104) is substantially aligned with the lateral geometric center of the quadrilateral block 106C. Because the material 108B and the quadrilateral block 106C are laterally aligned, when an external force is applied on the top surface 1081 of the material 108B, the quadrilateral block 106C can evenly distribute the striking force. In some embodiments, the material 108C has a different hardness from the quadrilateral block 106C. The quadrilateral block 106C is located under the material 108C and provides a different scheme as a buffer layer for the material 108C. While receiving a striking force from the membrane, the striking force is distributed over the top surface 1081 and a portion of the striking force is further transferred to the quadrilateral block 106C. In some embodiments, the hardness of the quadrilateral block 106C is smaller than the hardness of the material 108C.

In some embodiments, the quadrilateral block 106C is fully covered by the material 108C, i.e. there is no surface of the quadrilateral block 106C exposing from the material 108C. In some embodiments, the cross shaped portion 106B is partially covered by the material 108C and some sidewalls (perpendicular to the plane of 104) are exposed from the material 108B. The quadrilateral block 106C is symmetrically arranged in respect to the material 108C.

Similar to FIG. 2F, the mesa 108 also includes a portion 104A under the quadrilateral block 106C and the material 108C. Therefore, the mesa 108 also includes at least two different stress buffer layers disposed under the strike hitting potion, or the material 108C. Each buffer layer in the mesa 108 is at least partially covered by the strike hitting potion. The quadrilateral block 106C is also referred as a first buffer layer and has similar characteristics and correlation with other elements as the paired portion 106A in FIG. 2F or the cross shaped portion 106B in FIG. 3E. The portion 104A is the second buffer layer. These two buffer layers also have two different harnesses, i.e. one buffer layer is harder than the other. In some embodiments, the second buffer layer is harder than the first buffer layer. The first buffer layer is softer than the strike hitting potion so as to absorb a portion of the hitting force and the remaining portion of the hitting force is absorbed by the second buffer layer, which is harder than the first buffer layer. The quadrilateral block 106C is also symmetrically distributed under the force receiving surface 1081, thus the hitting force can be evenly distributed on the first buffer layer 106B.

Although several forms of the first buffer layer are illustrated herein, other shapes are also within the contemplated scope of the present disclosure. For example, a circular or polygon shape is alternatively used herein. In addition, the first buffer layer composed of disjoined symmetrical parts is also considered. For example, the paired portion 106A may be formed with curved sides. Alternatively, the first buffer layer is formed with a set of of concentric rings.

In some embodiments, a semiconductor device includes a cavity and a membrane in the cavity. The device also has a substrate on one side of the cavity and a mesa protruded from a surface of the substrate and toward the membrane. The mesa includes a material proximal to the membrane; a first buffer layer between the substrate and the material, and at least partially covered by the material. The mesa also includes a second buffer layer between the substrate and the first buffer layer, and partially covered by the first buffer layer, wherein the material contacts the second buffer layer, and the second buffer layer includes a hardness greater than a hardness of the first buffer layer.

In some embodiments, the membrane is movable in the cavity and the material is configured to be in contact with the membrane while the membrane is relocated toward the surface. In some embodiments, a hardness of the material is greater than a hardness of the first buffer layer. In some embodiments, the first buffer layer is partially between the second buffer layer and the material. In some embodiments, the first buffer layer is symmetrical with respect to the material.

In some embodiments, a sidewall of the first buffer layer is surrounded by the material. In some embodiments, a top surface of the first buffer layer is surrounded by the material. In some embodiments, the first buffer layer comprises a paired portions and a gap between the paired portions is filled with the material. In some embodiments, the first buffer layer is enclosed by the material.

A semiconductor device includes a substrate and a movable membrane proximal to the substrate. The semiconductor device further includes a mesa over the substrate and protruded from a surface of the substrate toward the movable membrane. The mesa includes a strike hitting portion configured to receive a striking force from the membrane and a hybrid stress buffer under the strike hitting portion, wherein the hybrid stress buffer includes at least two layers which are distinguishable by a difference in hardness.

In some embodiments, the at least two layers is respectively in contact with the strike hitting portion. In some embodiments, one of the at least two layers is in a cross shape. In some embodiments, one of the at least two layers is in a quadrilateral shape. In some embodiments, a lateral geometric center of the strike hitting portion is aligned with a lateral geometric center of one of the at least two layers. In some embodiments, a center line of the strike hitting portion is aligned with a center line of the one of the at least two layers. In some embodiments, at least one of the at least two layers comprises a hardness smaller than a hardness of the strike hitting portion.

A method of manufacturing a semiconductor device includes providing a substrate and disposing a first layer over the substrate. The method also includes disposing a second layer over the first layer and patterned the second layer to expose a portion of the second layer. The method also includes disposing a third layer over the first layer and the second layer thereby having the third layer concurrently being in contact with the first layer and the exposed second layer; and partially removing the third layer to form a mesa protruding from the substrate.

In some embodiments, a recess on the first layer adjacent to the mesa is formed while partially removing the third layer. In some embodiments, the method also includes forming a movable membrane above the mesa. In some embodiments, the method also includes forming a cavity in the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a cavity;
   a membrane in the cavity;
   a substrate on one side of the cavity; and
   a mesa protruded from a surface of the substrate and toward the membrane, wherein the mesa comprises:
   a material proximal to the membrane;
   a first buffer layer between the substrate and the material, and at least partially covered by the material; and
   a second buffer layer between the substrate and the first buffer layer, and partially covered by the first buffer layer, wherein the material contacts the second buffer layer, and the second buffer layer includes a hardness greater than a hardness of the first buffer layer.

2. The semiconductor device of claim 1, wherein the membrane is movable in the cavity and the material is configured to be in contact with the membrane while the membrane is relocated toward the surface.

3. The semiconductor device of claim 1, wherein a hardness of the material is greater than a hardness of the first buffer layer.

4. The semiconductor device of claim 1, wherein the first buffer layer is partially between the second buffer layer and the material.

5. The semiconductor device of claim 1, wherein the first buffer layer is symmetrical with respect to the material.

6. The semiconductor device of claim 1, wherein a sidewall of the first buffer layer is surrounded by the material.

7. The semiconductor device of claim 1, wherein a top surface of the first buffer layer is surrounded by the material.

8. The semiconductor device of claim 1, wherein the first buffer layer comprises a paired portions and a gap between the paired portions is filled with the material.

9. The semiconductor device of claim 1, wherein the first buffer layer is enclosed by the material.

10. A semiconductor device, comprising:
    a substrate;
    a movable membrane proximal to the substrate; and
    a mesa over the substrate and protruded from a surface of the substrate toward the movable membrane, wherein the mesa comprises:
    a strike hitting portion configured to receive a striking force from the membrane; and
    a hybrid stress buffer under the strike hitting portion, wherein the hybrid stress buffer includes at least two layers which are distinguishable by a difference in hardness.

11. The semiconductor device of claim 10, wherein the at least two layers is respectively in contact with the strike hitting portion.

12. The semiconductor device of claim 10, wherein one of the at least two layers is in a cross shape.

13. The semiconductor device of claim 10, wherein one of the at least two layers is in a quadrilateral or circular shape.

14. The semiconductor device of claim 10, wherein a lateral geometric center of the strike hitting portion is aligned with a lateral geometric center of one of the at least two layers.

15. The semiconductor device of claim 10, wherein a center line of the strike hitting portion is aligned with a center line of the one of the at least two layers.

16. The semiconductor device of claim 10, wherein at least one of the at least two layers comprises a hardness smaller than a hardness of the strike hitting portion.

17. A semiconductor device, comprising:
 a substrate;
 a movable membrane proximal to the substrate; and
 a mesa protruded from a surface of the substrate and toward the membrane, wherein the mesa comprises:
  a first layer configured to receive a striking force from the membrane;
  a second layer over the substrate; and
  a third layer between the first layer and the second layer, the first layer partially contacting the second layer and partially contacting the third layer, and the third layer including a hardness smaller than a hardness of the first layer and a hardness of the second layer.

18. The semiconductor device of claim 17, wherein the third layer is partially covered at a top surface thereof by a strike hitting potion of the first layer.

19. The semiconductor device of claim 17, wherein at least a sidewall of the third layer is exposed from the first layer.

20. The semiconductor device of claim 17, wherein the third layer comprises at least two disjoined parts symmetrically disposed with respect to the first layer.

* * * * *